US012651630B2

(12) United States Patent
Lee et al.

(10) Patent No.: US 12,651,630 B2
(45) Date of Patent: Jun. 9, 2026

(54) TRACKING SCHEME CIRCUIT OF MEMORY DEVICE AND METHODS FOR OPERATING THE SAME

(71) Applicant: Taiwan Semiconductor Manufacturing Company, Ltd., Hsinchu (TW)

(72) Inventors: Chun-Ying Lee, Hsinchu City (TW); Chieh Lee, Hsinchu City (TW); Tung-Cheng Chang, Hsinchu City (TW); Yen-Hsiang Huang, Hsinchu City (TW); Chia-En Huang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 266 days.

(21) Appl. No.: 18/480,762

(22) Filed: Oct. 4, 2023

(65) Prior Publication Data

US 2025/0118361 A1 Apr. 10, 2025

(51) Int. Cl.
*G11C 11/00* (2006.01)
*G11C 5/06* (2006.01)
(Continued)

(52) U.S. Cl.
CPC ............. *G11C 11/419* (2013.01); *G11C 5/063* (2013.01); *G11C 8/08* (2013.01); *H10B 10/18* (2023.02);
(Continued)

(58) Field of Classification Search
CPC ......... G11C 11/419; G11C 5/063; G11C 8/08; H01L 23/5222; H01L 23/5226; H01L 23/5228; H01L 23/5283
See application file for complete search history.

(56) References Cited

U.S. PATENT DOCUMENTS

| | | | | |
|---|---|---|---|---|
| 8,773,927 B2 * | 7/2014 | Evans | .................... | G11C 29/02 365/194 |
| 8,811,070 B1 * | 8/2014 | Rai | ........................ | G11C 11/413 365/194 |

(Continued)

FOREIGN PATENT DOCUMENTS

| | | |
|---|---|---|
| TW | I474336 B | 2/2015 |
| TW | I764759 B | 5/2022 |

OTHER PUBLICATIONS

Office Action issued in Taiwan Appl. No. 113103418 dated May 23, 2025.

*Primary Examiner* — Pho M Luu
(74) *Attorney, Agent, or Firm* — Foley & Lardner LLP

(57) ABSTRACT
A memory device comprises a memory array, a plurality of access word lines, and a first tracking word line. The memory array may include a plurality of bit cells arranged over a plurality of rows and a plurality of columns. The plurality of access word lines may extend along a lateral direction. The plurality of rows may operatively correspond to the plurality of access word lines, respectively. The first tracking word line may also extend along the lateral direction and have a first portion extending from an edge of the memory array to a middle of the memory array and a second portion extending from the middle of the memory array to the edge of the memory array. The first combination can be different from the second combination.

20 Claims, 11 Drawing Sheets

(51) Int. Cl.

| | |
|---|---|
| *G11C 8/08* | (2006.01) |
| *G11C 11/419* | (2006.01) |
| *H10B 10/00* | (2023.01) |
| *H10W 20/40* | (2026.01) |
| *H10W 20/41* | (2026.01) |
| *H10W 20/42* | (2026.01) |

(52) U.S. Cl.
CPC ......... *H10W 20/42* (2026.01); *H10W 20/435* (2026.01); *H10W 20/495* (2026.01); *H10W 20/498* (2026.01)

(56) References Cited

U.S. PATENT DOCUMENTS

| | | | |
|---|---|---|---|
| 11,651,804 B2 | 5/2023 | Chien-Kuo et al. | |
| 11,735,251 B2 | 8/2023 | Yang et al. | |
| 12,073,886 B2 * | 8/2024 | Petti ...................... | G11C 16/10 |

* cited by examiner

800

M3

M2

802

M1

TRKWL parallel M1+M3
with 3 VIA (3 $C_{VIA}$):

810a

810b

810c $C_{VIA}$

M3

M2

804

M1

TRKWL parallel M1+M3
with 4 VIA (4 $C_{VIA}$):

810a

810b

810c

810d $C_{VIA}$

TRACKING SCHEME CIRCUIT OF MEMORY DEVICE AND METHODS FOR OPERATING THE SAME

BACKGROUND

In the pursuit of continuous advancements in semiconductor technology, the development of advanced technology nodes has become imperative. In these nodes, one aspect that desires much attention is the delay tracking scheme employed in Static Random Access Memory (SRAM) designs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
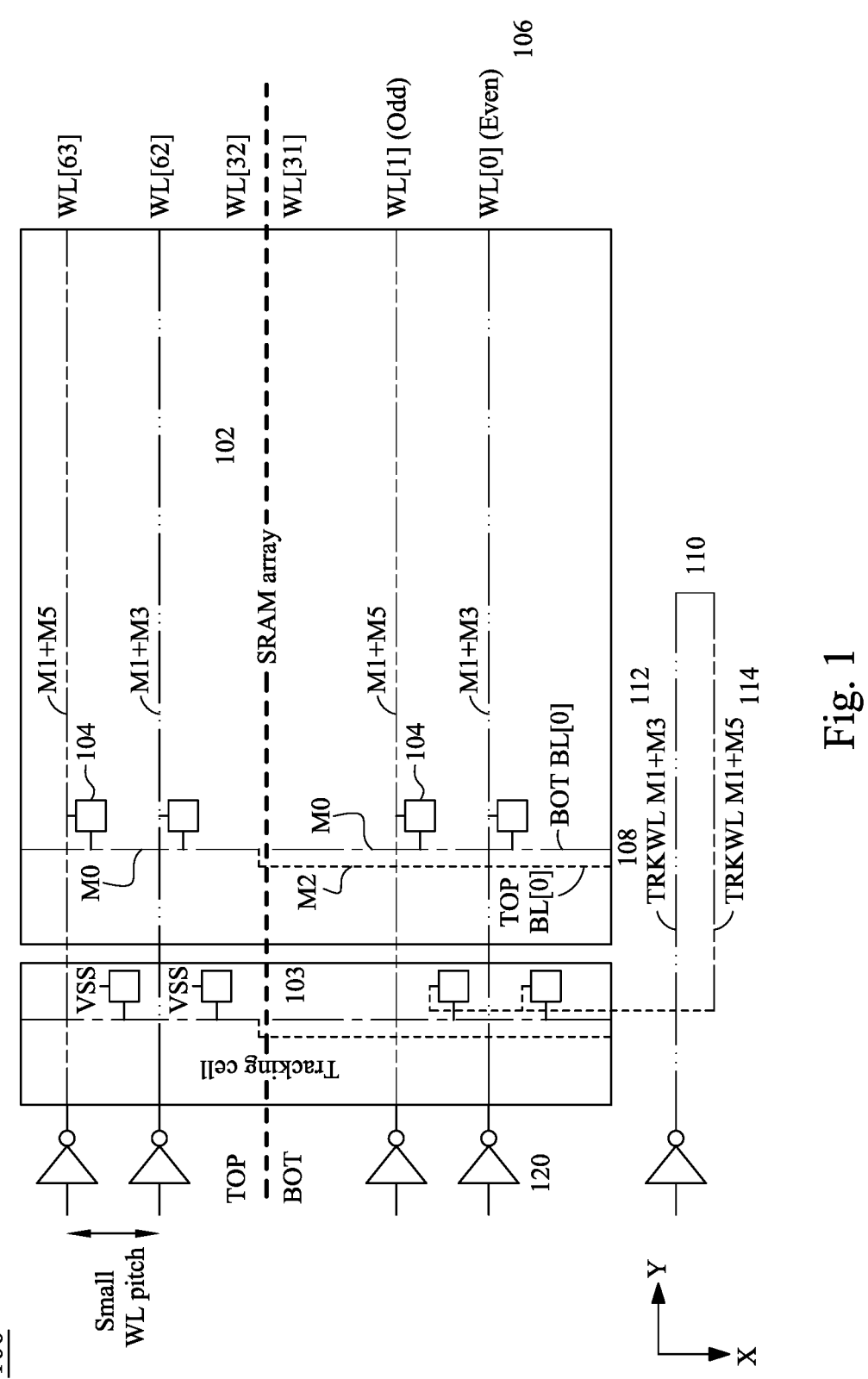
FIG. 1 illustrates a schematic diagram of a system including a tracking scheme circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One particular challenge in SRAM arrays is the large resistance encountered in the word line (WL) due to the use of wide input/output (I/O) interfaces. To address this issue, a double WL scheme, combining metal-1 (M1) and metal-3 (M3) in parallel, is implemented. This configuration helps mitigate the impact of the high WL resistance, ensuring reliable and efficient operation. However, the reduced height of SRAM bit cells in advanced technology nodes leads to smaller WL pitches, posing a new obstacle. The conventional double WL scheme cannot be directly applied within each WL pitch, necessitating a modified approach. As a result, the SRAM array requires the separation of WLs into WL even and WL odd categories. While WL even employs M1 and M3, WL odd may utilize M1 and metal-5 (M5). At the same time, this distinction in WL configurations introduces deviations in the original delay tracking scheme, affecting its accuracy in accounting for process variations. The usage of the even/odd WLs may cause the original delay tracking scheme cannot trace each WL resistive-capacitive (RC) delay precisely. For example, a delay tracking scheme using M1 and M3 WLs may not trace a RC delay for M1 and M5 WLs accurately.

To address these challenges, an improved SRAM delay tracking scheme is necessary. The scheme may consider the peculiarities of advanced technology nodes, such as the double WL approach, the need for separate WLs, and the impact of process variations. By developing a refined delay tracking scheme, it becomes possible to achieve enhanced performance and robustness in SRAM designs within advanced technology nodes beyond typical process nodes used in industry.

FIG. 1 illustrates a schematic diagram of a system 100 including a tracking scheme circuit 110, in accordance with some embodiments. The system 100 may include a memory array 102, a plurality of access word lines (WLs) 106, a plurality of access bit lines (BLs) 108, a first tracking word line 110, and a plurality of inverters 120. The memory array 102 can be a static random access memory (SRAM). The memory array 102 may include a plurality of bit cells 104 arranged over a plurality of rows and a plurality of columns. The plurality of rows may operatively correspond to the plurality of access WLs 106, respectively. The plurality of columns may operatively correspond to the plurality of access BLs 108, respectively. Despite not being explicitly shown in FIG. 1, the components of the plurality of bit cells 104 may be operatively (e.g., electrically) coupled to each other and to an input/output (I/O) circuit and/or a control circuit (both not shown in FIG. 1). Although, in the illustrated example of FIG. 1, the components are shown as separate blocks for the purpose of clear illustration, in some other embodiments, some or all of the components shown in FIG. 1 may be integrated together. For example, the memory array 102 may include the plurality of inverters 120.

A subset of the bit cells 104 can be enlisted, or re-purposed, for delay tracking and can be referred to as tracking cells 103. Various numbers of tracking cells 103, including one tracking cell, may be used. In the exemplary embodiments, the tracking cells 103 do not function as the nominal bit cells do in terms of storing data and supporting read/write operations. Rather, various bit lines that are otherwise used for addressing cells in the case of nominal cells are enlisted for other purposes.

The plurality of access WLs 106 may extend along a lateral direction (e.g., Y direction). The plurality of access WLs 106 can be used to select and activate specific rows of SRAM cells 104 within the memory array 102. When a particular row is selected by energizing the corresponding WL, it allows for read or write operations to be performed on the cells within that row. The activation of the WL may enable the transfer of data between the memory cells and the bit lines.

The plurality of access BLs 108 may extend along a vertical direction (e.g., X direction). The plurality of access BLs 108 can be responsible for carrying data to and from the SRAM cells 104. Bit lines can be organized in pairs (e.g., bit line and bit line bar), with each pair associated with a specific column of SRAM cells. During read operations, the stored data of the selected cell is transferred to the corresponding bit line pair, enabling the retrieval of information. During write operations, the data to be stored is applied to the appropriate bit line pair, facilitating the programming of the targeted memory cells.

The first tracking WL 110 may also extend along the lateral direction. The first tracking word line 110 can be configured to track propagation time present on the access word lines 106. The first tracking WL 110 may have a first portion 112 extending from an edge of the memory array 102 to a middle of the memory array 102 and a second portion 114 extending from the middle of the memory array 102 to the edge of the memory array 102. The first portion 112 of the first tracking WL 110 may include at least two first conductor lines respectively disposed across a first combination of a plurality of metallization layers (e.g., M1+M3). The second portion 114 of the first tracking word line 110 may include at least two second conductor lines respectively disposed across a second combination of the plurality of metallization layers (e.g., M1+M5). The first combination is different from the second combination.

By utilizing different combinations of metallization layer for the first half 112 and the last half 114 of the tracking WL 110, the first tracking WL 110 may reduce a macro data output delay (Tcd) variation. The tracking WL 110 can be compatible/applied across various advanced SRAM processes. The detailed implementation of the first tracking WL 110 is discussed in FIG. 2.

In some embodiments, the first half tracking WL 112 may use M1 and M3 and the last half tracking WL 114 may use M1 and M5. As shown in Table 1, when considering the parasitic resistance of both the word lines formed by metal 1 and metal 3 (M1+M3) and the word lines formed by metal 1 and metal 5 (M1+M5), assumed to be "R", along with a capacitor value of "C", it can be deduced that the RC delay associated with each word line is equal to R*C.

4

TABLE 1

| | M1 + M3 Res | M1 + M3 Cap | M1 + M5 Res | M1 + M5 Cap | R*C delay |
|---|---|---|---|---|---|
| M1 + M3 WL RC delay | R | C | | | RC |
| M1 + M5 WL RC delay | | | R | C | RC |

In Table 2, assuming the parasitic resistance of the word lines formed by metal 1 and metal 5 (M1+M5) being double to "2R" because of process variations, the RC delay associated with the M1+M5 word lines becomes 2R*C. The RC delay associated with the M1+M3 word lines is equal to R*C. To mitigate the impact of this variation, the present disclosure provides a tracking scheme incorporating factors related to both M1+M3 and M1+M5 word lines in the delay tracking process. By considering both factors, the tracking scheme aims to minimize differences and achieve more precise delay tracking, leading to improved performance and reliability in advanced SRAM designs.

TABLE 2

| | M1 + M3 Res | M1 + M3 Cap | M1 + M5 Res | M1 + M5 Cap | R*C delay |
|---|---|---|---|---|---|
| M1 + M3 WL RC delay | R | C | | | RC |
| M1 + M5 WL RC delay | | | 2R | C | 2RC |
| Proposed TRKWL RC delay | 0.5R | 0.5C | R | 0.5C | 1.5RC |

In a tracking scheme that considers only one combination (either M1+M3 or M1+M5) of metallization layers for an entire tracking word line, there can be a significant difference between the real M1+M5 RC delay (e.g., 2RC) and the tracking scheme delay (e.g., RC). This difference may be larger (e.g., 2RC−RC=1RC) compared to the proposed tracking scheme, which takes into account different combinations (M1+M3 and M1+M5). In the proposed scheme, the difference between the real M1+M5 RC delay and the tracking scheme delay is reduced (e.g., 2RC−1.5RC=0.5RC). By considering multiple combinations of metallization layers, the proposed scheme aims to improve accuracy and minimize discrepancies in the delay tracking process, resulting in more reliable and efficient performance in advanced SRAM designs.

The plurality of inverters 120 may amplify and regenerate the stored data during read and write operations. In certain embodiments, the plurality of inverters 120 may also provide a fixed basic delay. The plurality of inverters 120 may insert a delay so as to move ahead a measurement window in which a tracking delay can be discerned.

Figure 2:
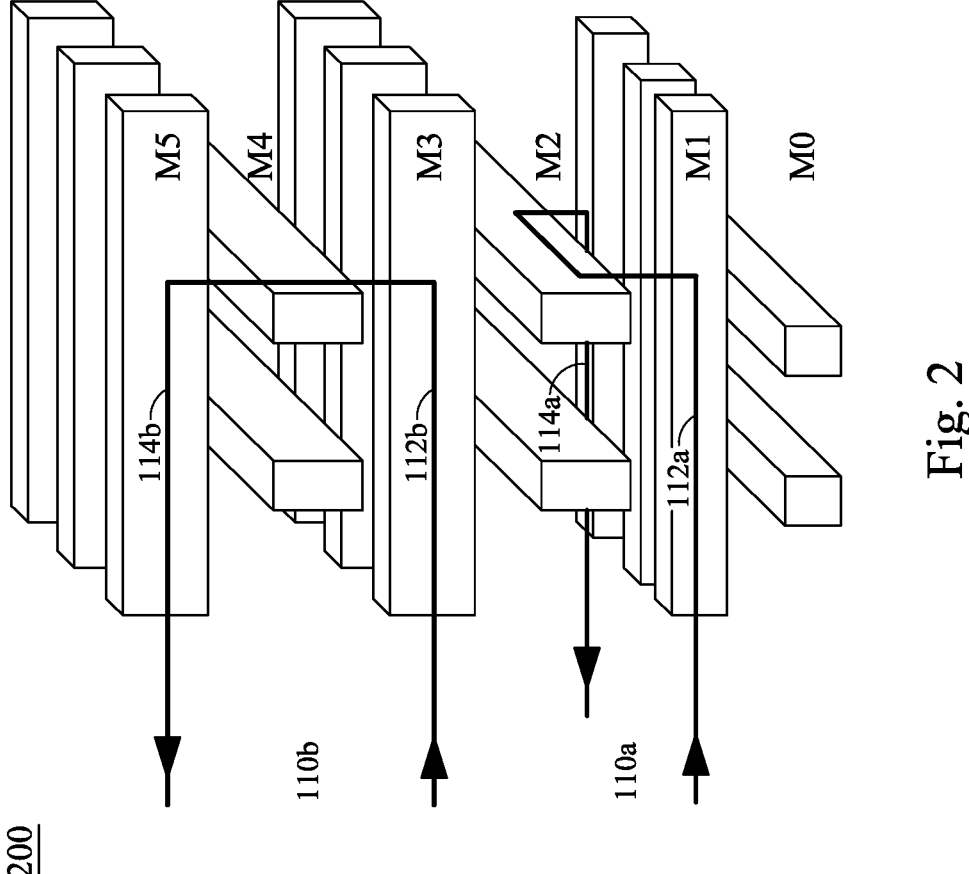
FIG. 2 illustrates a cross-sectional view of an example tracking scheme circuit shown in FIG. 1, in accordance with some embodiments.

FIG. 2 illustrates a cross-sectional view of an example tracking scheme circuit 110 shown in FIG. 1, in accordance with some embodiments. FIG. 2 illustrates a path of a tracking scheme circuit 110 in a multi-layer interconnect structure (e.g., M0, M1, M2, M3, M4 and M5 layers).

A tracking word line (WL) 110 may have a first portion 112 and a second portion 114. The first portion 112 of the tracking WL 110 may include at least two first conductor lines respectively disposed across a first combination of a plurality of metallization layers (e.g., M1+M3). The first combination may include a first one of the plurality of metallization layers that is the first closest to the memory array 102 (e.g., 112*a* in M1) and a second one of the plurality of metallization layers that is the third closest to the memory array 102 (e.g., 112*b* in M3). The second portion 114 of the tracking WL 110 may include at least two second conductor lines respectively disposed across a second combination of the plurality of metallization layers (e.g., M1+M5). The second combination includes the first metallization layer (e.g., 114*a* in M1) and a third one of the plurality of metallization layers that is the fifth closest to the memory array 102 (e.g., 114*b* in M5).

The first portion 112 and the second portion 114 can be coupled/interconnected to each other through multiple via structures (e.g., VIAs). For example, the tracking word line (WL) 110*a* in M1 may include a first half portion 112*a* and a second half portion 114*a*. The first half portion 112*a* can be coupled to the second half portion 114*a* through a VIA1 (located between M1 and metal 2 (M2)) and a section of a conductor line disposed in M2. Thus, the path of the tracking word line (WL) 110*a* can be described as M1-VIA1-M2-VIA1-M1. For another example, the tracking word line (WL) 110*b* in M3 and M5 may include a first half portion 112*b* and a second half portion 114*b*. The first half portion 112*b* can be coupled to the second half portion 114*b* through a VIA3 (located between M3 and metal 4 (M4)) and a VIA4 (located between M4 and M5). Thus, the path of the tracking word line (WL) 110*b* can be described as M3-VIA3-VIA4-M5. In some embodiments, the at least two first conductor lines 110*a* and 110*b* can be coupled to each other through a plural number of via structures (e.g., VIA1, VIA2, VIA3, or VIA4).

Figure 3:
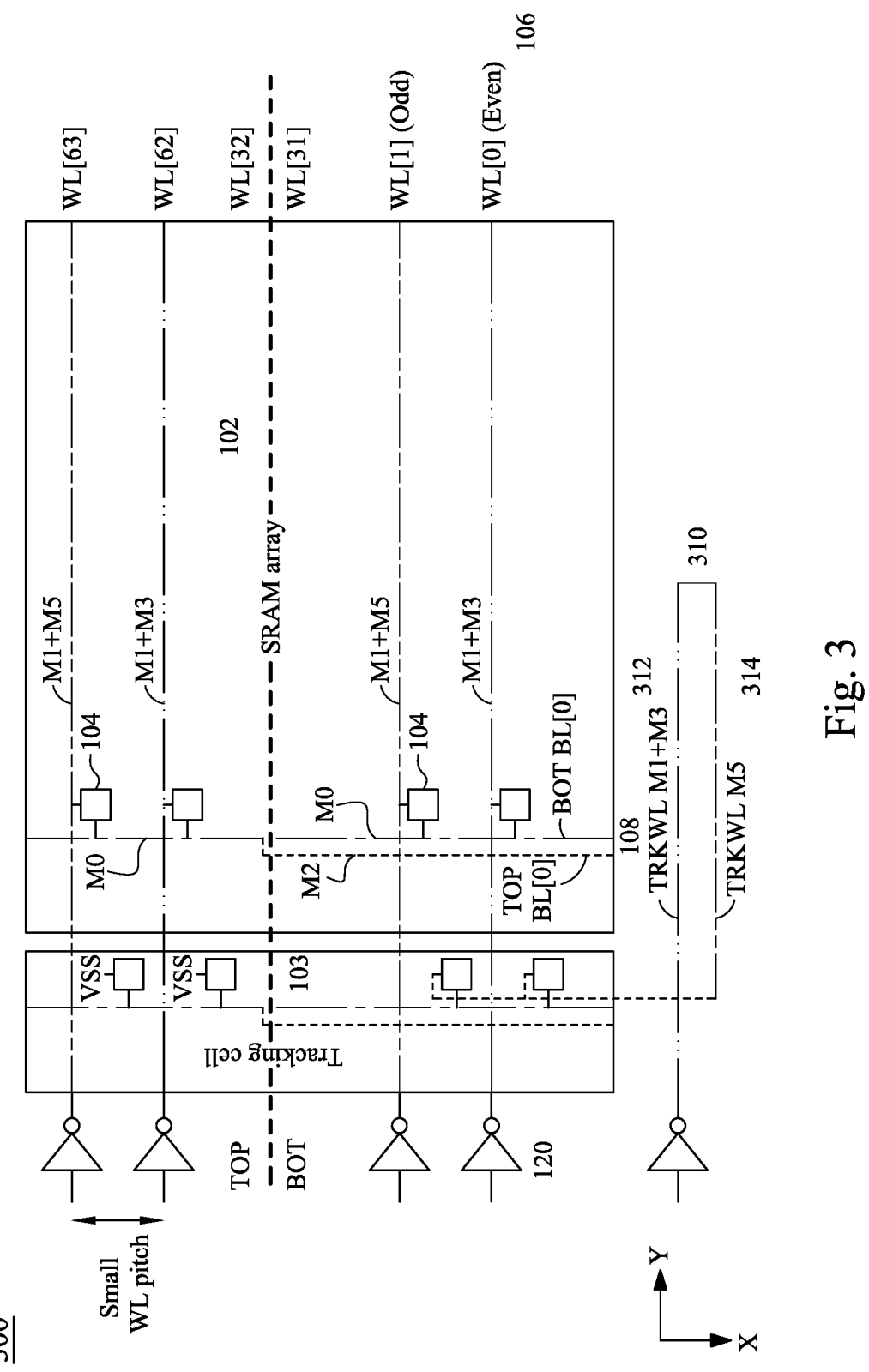
FIG. 3 illustrates a schematic diagram of a system including a tracking scheme circuit, in accordance with some embodiments.

FIG. 3 illustrates a schematic diagram of a system 300 including a tracking scheme circuit 310, in accordance with some embodiments. The system 300 may include a memory array 102, a plurality of access word lines (WLs) 106, a plurality of access bit lines (BLs) 108, a first tracking word line 310, and a plurality of inverters 120. The system 300 of FIG. 3 is substantially similar to the system 100 of FIG. 1, except for the detailed first tracking word line 310 with a different tracking word line path/scheme. Thus, the following description of the system 300 will be focused on the difference.

The first tracking WL 310 may have a first portion 312 extending from an edge of the memory array 102 to a middle of the memory array 102 and a second portion 314 extending from the middle of the memory array 102 to the edge of the memory array 102. The first half tracking WL 312 may use M1 and M3 and the last half tracking WL 314 may use M5. The first portion 312 of the first tracking WL 310 may include at least two first conductor lines respectively disposed across a first combination of a plurality of metallization layers (e.g., M1+M3). The second portion 314 of the first tracking word line 310 may include a second conductor line disposed across a metallization layer (e.g., M5).

By utilizing different combinations of metallization layer for the first half 312 and the last half 314 of the tracking WL 310, the first tracking WL 310 may reduce a macro data output delay (Tcd) variation. The tracking WL 310 can be compatible/applied across various advanced SRAM processes.

Figure 4:
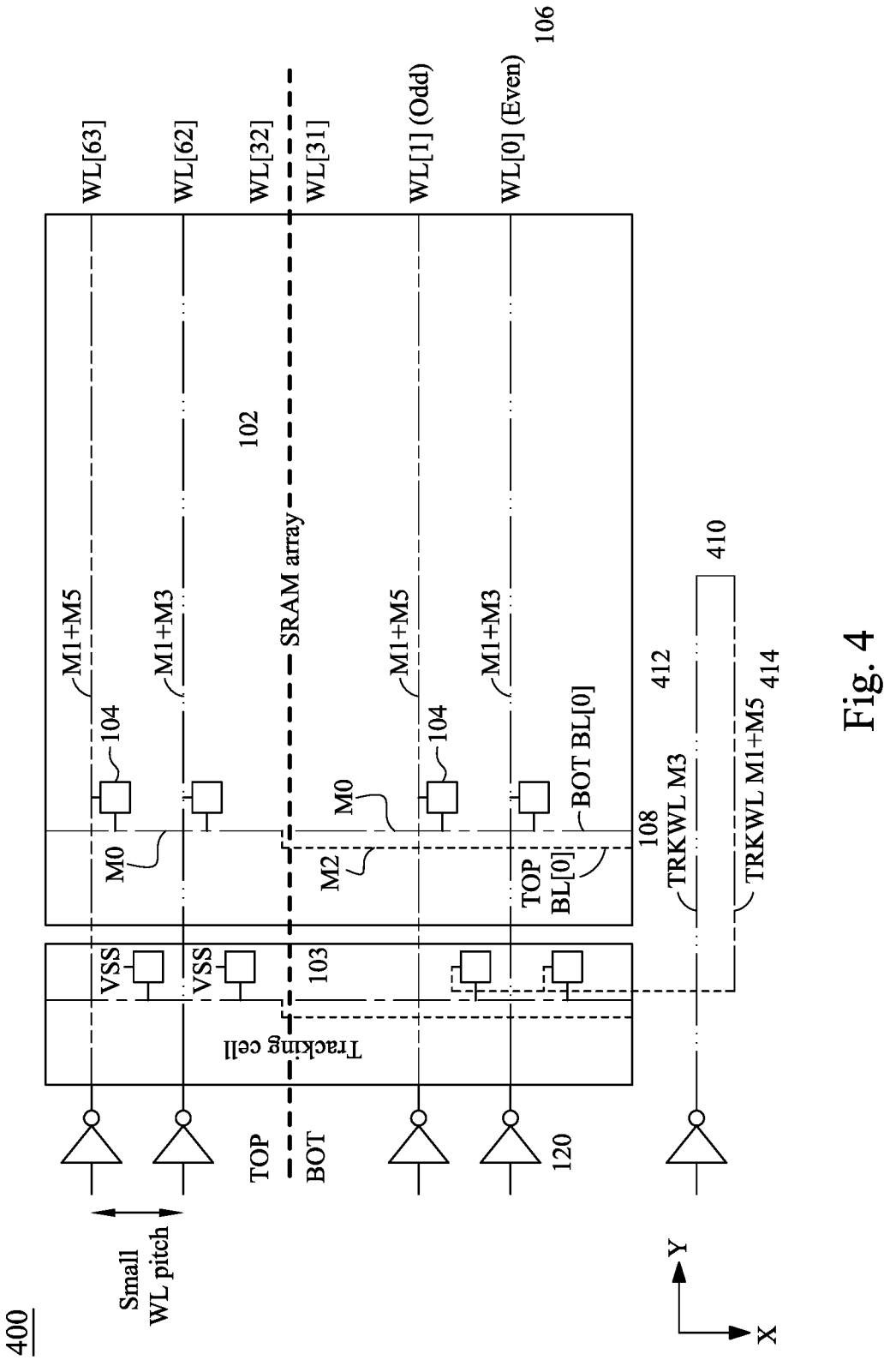
FIG. 4 illustrates a schematic diagram of a system including a tracking scheme circuit, in accordance with some embodiments.

FIG. 4 illustrates a schematic diagram of a system 400 including a tracking scheme circuit 410, in accordance with some embodiments. The system 400 may include a memory array 102, a plurality of access word lines (WLs) 106, a plurality of access bit lines (BLs) 108, a first tracking word line 410, and a plurality of inverters 120. The system 400 of FIG. 4 is substantially similar to the system 100 of FIG. 1, except for the detailed first tracking word line 410 with a different tracking word line path/scheme. Thus, the following description of the system 400 will be focused on the difference.

The first tracking WL 410 may have a first portion 412 extending from an edge of the memory array 102 to a middle of the memory array 102 and a second portion 414 extending from the middle of the memory array 102 to the edge of the memory array 102. The first half tracking WL 412 may use M3 and the last half tracking WL 414 may use M1 and M5. The first portion 412 of the first tracking word line 410 may include a first conductor line disposed across a metallization layer (e.g., M3). The second portion 414 of the first tracking WL 410 may include at least two first conductor lines respectively disposed across a first combination of a plurality of metallization layers (e.g., M1+M5).

By utilizing different combinations of metallization layer for the first half 412 and the last half 414 of the tracking WL 410, the first tracking WL 410 may reduce a macro data output delay (Tcd) variation. The tracking WL 410 can be compatible/applied across various advanced SRAM processes.

Figure 5:
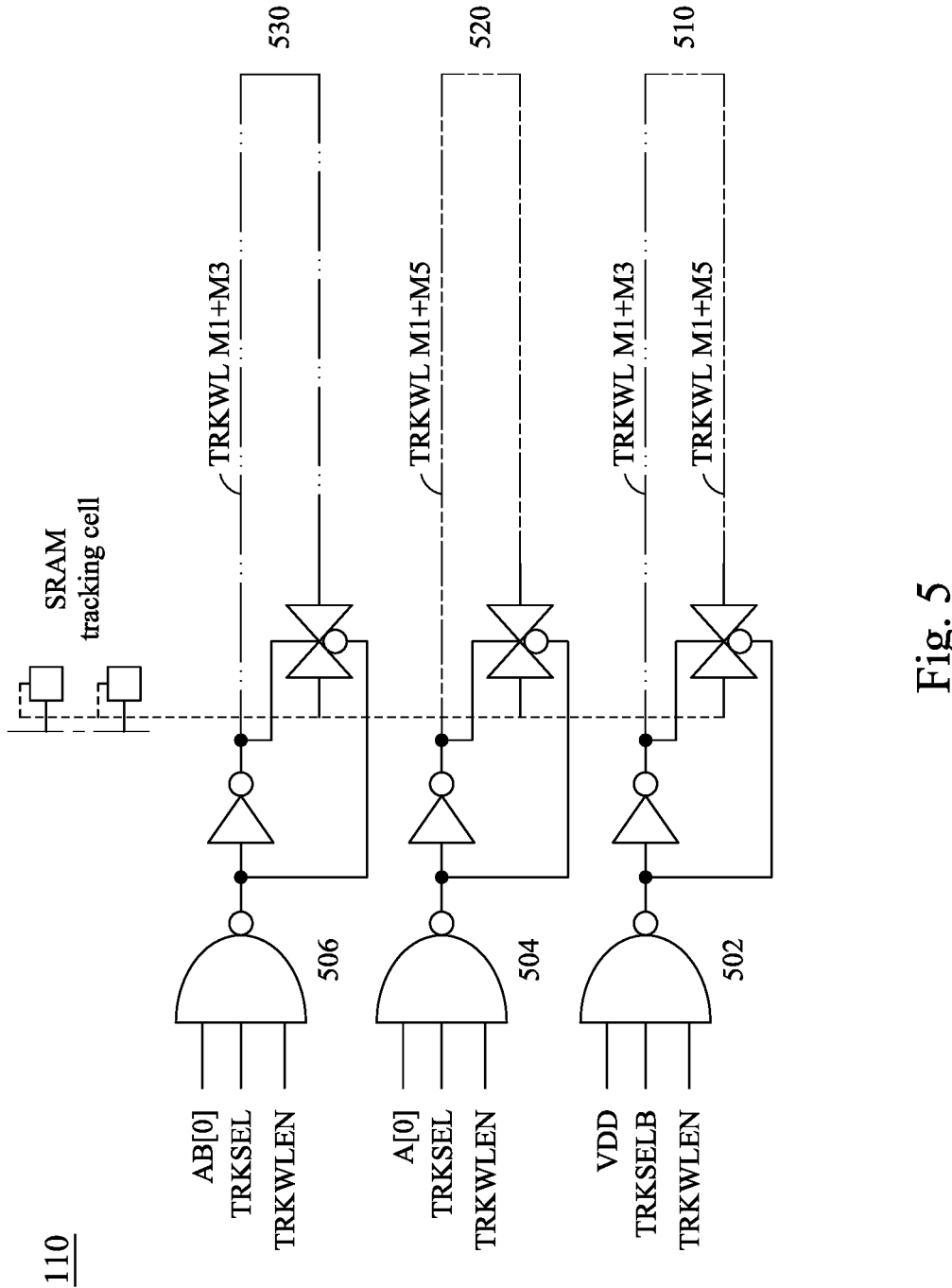
FIG. 5 illustrates a schematic diagram of a tracking scheme circuit shown in FIG. 1, in accordance with some embodiments.

FIG. 5 illustrates a schematic diagram of a tracking scheme circuit 110 shown in FIG. 1, in accordance with some embodiments. The tracking scheme circuit 110 may include a plurality of address decoders 502, 504, 506, a first tracking word line 510, a second tracking word line 520, and a third tracking word line 530. The tracking scheme circuit 110 of FIG. 5 is substantially similar to the tracking scheme circuit 110 of FIG. 1, except for the detailed first tracking word line 110 to further precisely select a tracking WL path/scheme. Thus, the following description of the tracking scheme circuit 110 will be focused on the difference.

To enable a selection of a precise tracking word line (WL) path, an address decode in a tracking scheme driver can be combined. An A[0] signal can be utilized for decoding WL even/odd, thereby facilitating the accurate determination of the appropriate WL path in the tracking scheme.

As shown in FIG. 5, a VDD signal, a TRKSELB signal, and a TRKWLEN signal can be inputs of a first WL decoder 502. An A[0] signal, a TRKSEL signal, and the TRKWLEN signal can be inputs of a second WL decoder 504. An AB[0] signal, the TRKSEL signal, and the TRKWLEN signal can be inputs of a third WL decoder 504. The output of the plurality of address decoders 502, 504, 506 may drive WL drivers to select a type of tracking WL path that will be used in a SRAM.

In the memory array 102, the first tracking word line 510 may extend along the lateral direction (e.g., Y direction). The first tracking word line 510 may have a first portion extending from an edge of the memory array to a middle of the memory array and a second portion extending from the middle of the memory array 102 to the edge of the memory array 102. The first portion of the first tracking WL 510 may include at least two first conductor lines respectively disposed across a first combination of a plurality of metallization layers (e.g., M1+M3). The second portion of the first tracking word line 510 may include at least two second conductor lines respectively disposed across a second combination of the plurality of metallization layers (e.g., M1+M5). The first combination is different from the second combination.

In the memory array 102, the second tracking word line 520 may extend along the lateral direction (e.g., Y direction). The second tracking word line 520 may have a first portion extending from an edge of the memory array to a middle of the memory array 102 and a second portion extending from the middle of the memory array to the edge of the memory array 102. The first portion of the second tracking word line 520 may each include at least two third conductor lines respectively disposed across the first combination of the plurality of metallization layers (e.g., M1+M5). The second portion of the second tracking word line 520 may include at least two fourth conductor lines respectively disposed across the first combination of the plurality of metallization layers (e.g., M1+M5).

In the memory array 102, the third tracking word line 530 may extend along the lateral direction (e.g., Y direction). The third tracking word line 530 may have a first portion extending from an edge of the memory array to a middle of the memory array 102 and a second portion extending from the middle of the memory array to the edge of the memory array 102. The first portion of the third tracking word line 530 may each include at least two fifth conductor lines respectively disposed across the second combination of the plurality of metallization layers (e.g., M1+M3). The second portion of the third tracking word line 530 include at least two sixth conductor lines respectively disposed across the second combination of the plurality of metallization layers (e.g., M1+M3).

The first to third tracking word lines 510, 520, 530 are each configured to track propagation time present on the access word lines 106. The second 520 and third 530 tracking word lines are each selected based on a signal decoding (e.g., A[0] signal, or AB[0] signal) one of the plurality of access word lines 106. The first tracking word line 510 can be selected independently of the signal. The A[0] signal can be utilized for decoding WL even/odd.

The A[0] signal can be employed for decoding the even/odd of word lines (WLs). The decoding determines the type of tracking WL path used in the SRAM. The options for the tracking WL path include M1+M3 for tracing WL even (e.g., third tracking word line 530), M1+M5 for tracing WL odd (e.g., second tracking word line 520), or a combination of M1+M3 and M1+M5 to trace specific portions of both WL even and WL odd (e.g., first tracking word line 510). This flexibility in selecting the tracking WL path allows for customization and optimization of SRAM designs based on specific requirements and performance considerations.

In Table 3, when the TRKWLEN signal is set to VDD, the TRKSEL signal is set to VDD, the TRKSELB signal is set to 0V, the A[0] signal is set to 0V, and the AB[0] signal is set to VDD, the tracking word line (TRKWL) formed by the combination of M1 and M3 (e.g., third tracking word line 530) can be selected. When the TRKWLEN signal is set to VDD, the TRKSEL signal is set to VDD, the TRKSELB signal is set to 0V, the A[0] signal is set to VDD, and the AB[0] signal is set to 0V, the tracking word line (TRKWL) formed by the combination of M1 and M5 (e.g., second tracking word line 520) can be selected. When the TRKWLEN signal is set to VDD, the TRKSEL signal is set to 0V, the TRKSELB signal is set to VDD, the A[0] signal is set to X, and the AB[0] signal is set to X, the tracking word line (TRKWL) formed by the combination of M1, M3, and M5 (e.g., first tracking word line 510) can be selected.

TABLE 3

| | TRKWLEN | TRKSEL | TRKSELB | A[0] | AB[0] |
|---|---|---|---|---|---|
| TRKWL M1 + M3 | VDD | VDD | 0V | 0V | VDD |
| TRKWL M1 + M5 | VDD | VDD | 0V | VDD | 0V |

TABLE 3-continued

| | TRKWLEN | TRKSEL | TRKSELB | A[0] | AB[0] |
|---|---|---|---|---|---|
| TRKWL M1 + M3 + M5 | VDD | 0V | VDD | X | X |

Figure 6:
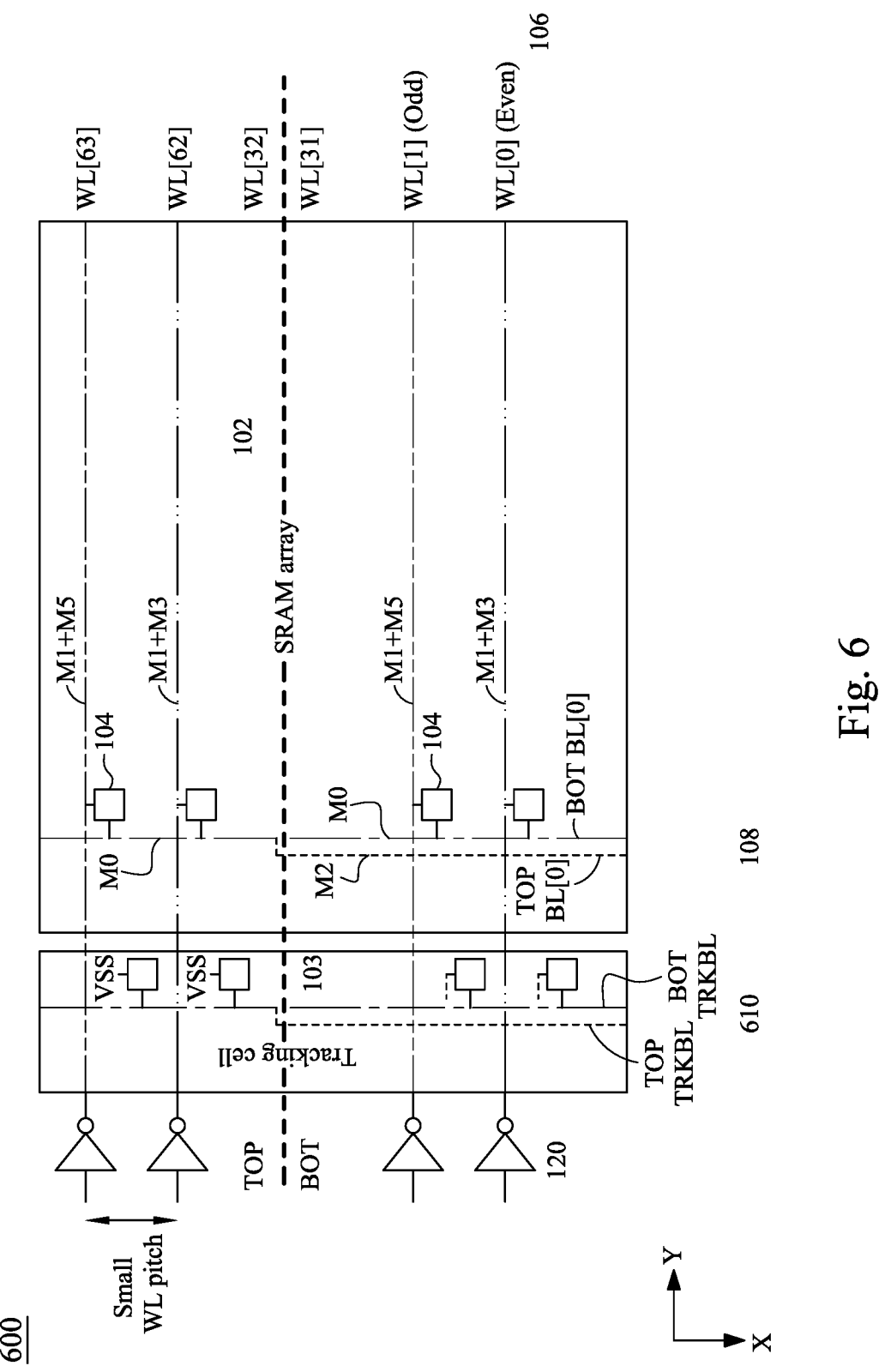
FIG. 6 illustrates a schematic diagram of a system including a tracking scheme circuit, in accordance with some embodiments.
Figure 7:
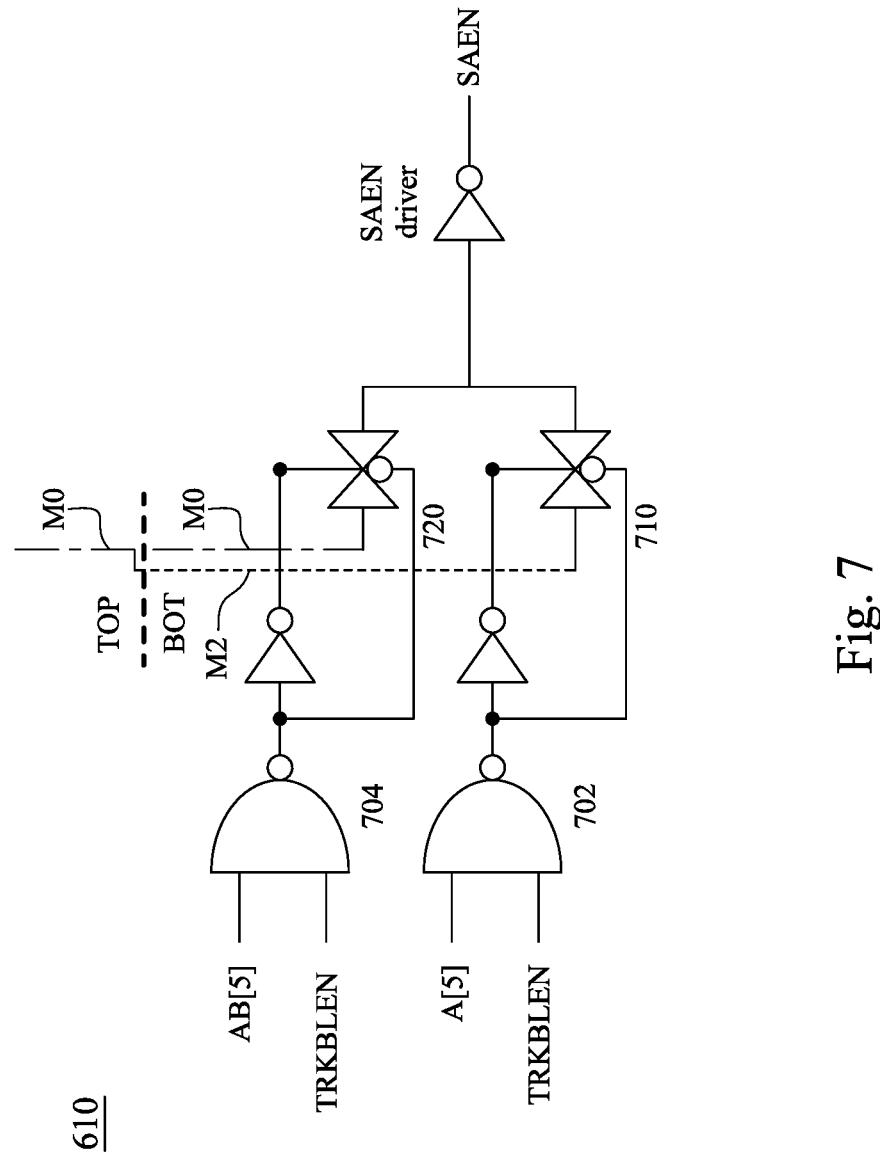
FIG. 7 illustrates a schematic diagram of a tracking scheme circuit shown in FIG. 6, in accordance with some embodiments.

FIG. 6 illustrates a schematic diagram of a system 600 including a tracking scheme circuit, in accordance with some embodiments. FIG. 7 illustrates a schematic diagram of a tracking scheme circuit 610 shown in FIG. 6, in accordance with some embodiments. The system 600 may include a memory array 102, a plurality of access word lines (WLs) 106, a plurality of access bit lines (BLs) 108, a first tracking bit line 610, and a plurality of inverters 120. The system 600 of FIG. 6 is substantially similar to the system 100 of FIG. 1, except for the detailed first tracking bit line 610 with a different tracking word line path/scheme. Thus, the following description of the system 600 will be focused on the difference.

The first tracking bit line 610 can be configured to track propagation time present on the access bit lines 108. The first tracking BL 610 may have a first portion extending from an bottom of the memory array 102 to a middle of the memory array 102 and a second portion extending from the middle of the memory array 102 to the bottom of the memory array 102. The first portion of the first tracking BL 610 may include at least two first conductor lines respectively disposed across a combination of a plurality of metallization layers. The second portion of the first tracking bit line 610 may include at least two second conductor lines respectively disposed across another combination of the plurality of metallization layers. The combinations can be different.

By utilizing different combinations of metallization layer for the first half and the last half of the tracking BL 610, the first tracking BL 610 may reduce a macro data output delay (Tcd) variation. The tracking BL 610 can be compatible/applied across various advanced SRAM processes.

An address decode in the tracking scheme receiver is combined to enable the selection of a precise tracking bit line (BL) path. An A[5] signal can be used to decode whether the BL is the top (TOP) or bottom (BOT) tracking BL. This decoding allows for the choice of the specific type of tracking BL path to be used in the SRAM. To enable a selection of a precise tracking bit line (BL) path, an address decode in a tracking scheme driver can be combined. The A[5] signal can be utilized for decoding BL TOP/BOT, thereby facilitating the accurate determination of the appropriate BL path in the tracking scheme.

As shown in FIG. 7, a TRKBLEN signal and a A[5] signal can be inputs of a first BL decoder 702. The TRKBLEN signal and a AB[5] signal can be inputs of a second BL decoder 704. The output of the plurality of address decoders 702, 704 may drive BL drivers to select a type of tracking BL path that will be used in a SRAM. The options for the tracking BL path include tracing the BOT TRKBL using M0, or tracing the TOP TRKBL by combining M0 and M2. This flexibility allows for customization and optimization of the SRAM design based on the specific requirements and performance considerations.

In Table 4, when the TRKBLEN signal is set to VDD, the A[5] signal is set to 0V, and the AB[5] signal is set to VDD, the tracking bit line (TRKBL) formed by the combination of M0 (e.g., second tracking bit line 720) can be selected. When the TRKBLEN signal is set to VDD, the A[5] signal is set to VDD, and the AB[5] signal is set to 0V, the tracking bit line (TRKBL) formed by the combination of M0 and M2 (e.g., first tracking bit line 710) can be selected.

TABLE 4

|  | TRKBLEN | A[5] | AB[5] |
|---|---|---|---|
| TRKBL M0 | VDD | 0V | VDD |
| TRKBL M0 + M2 | VDD | VDD | 0V |

By combining address decode and utilizing A[5] signal to determine the tracking BL type, designers can precisely select the appropriate tracking BL path in the SRAM design, ensuring efficient and reliable data storage and retrieval operations.

Figure 8:
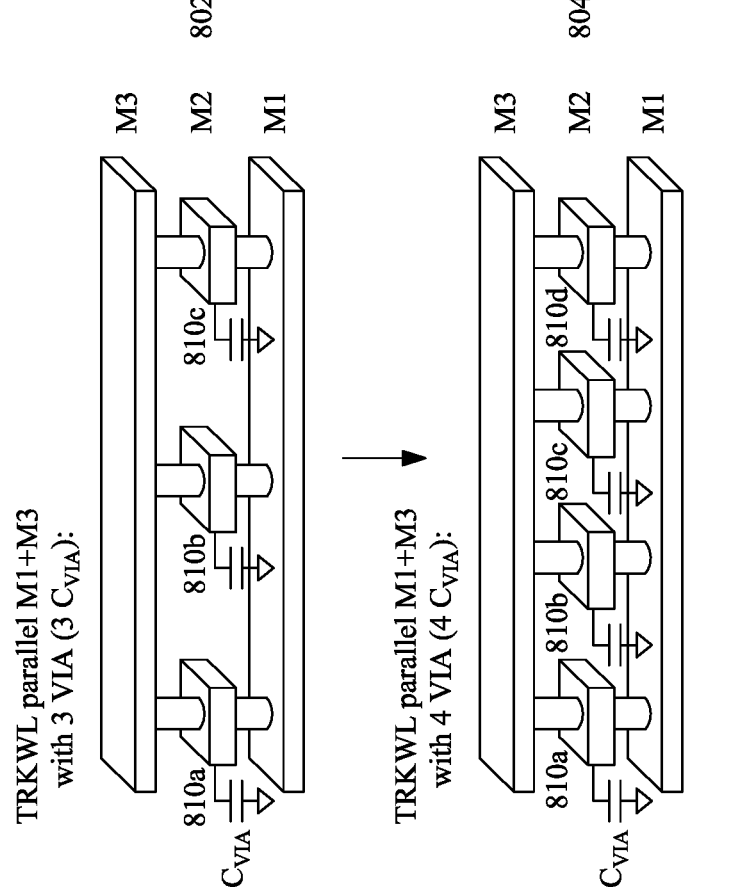
FIG. 8 illustrates a cross-sectional view of an example tracking scheme circuit shown in FIG. 1, in accordance with some embodiments.

FIG. 8 illustrates a cross-sectional view of an example tracking scheme circuit 110 shown in FIG. 1, in accordance with some embodiments. FIG. 8 illustrates tracking word line (TRKWL) using different number of VIA to adjust a capacitance level of a tracking scheme.

For example in FIG. 8, the tracking scheme circuit 802 may utilize three VIAs (e.g., 810a, 810b, 810c) and the tracking scheme circuit 804 may utilize four VIAs (e.g., 810a, 810b, 810c, 810d). The capacitance level of a tracking scheme can be adjusted by varying the number of VIA structures employed. The capacitance associated with the VIA structures can be utilized to modify the loading in the tracking scheme. Specifically, increasing the number of VIA structures results in a corresponding adjustment of the capacitance level (e.g., from $+1*C_{VIA}$ to $N*C_{VIA}$), allowing for fine-tuning of the tracking scheme's characteristics and performance.

Figure 9:
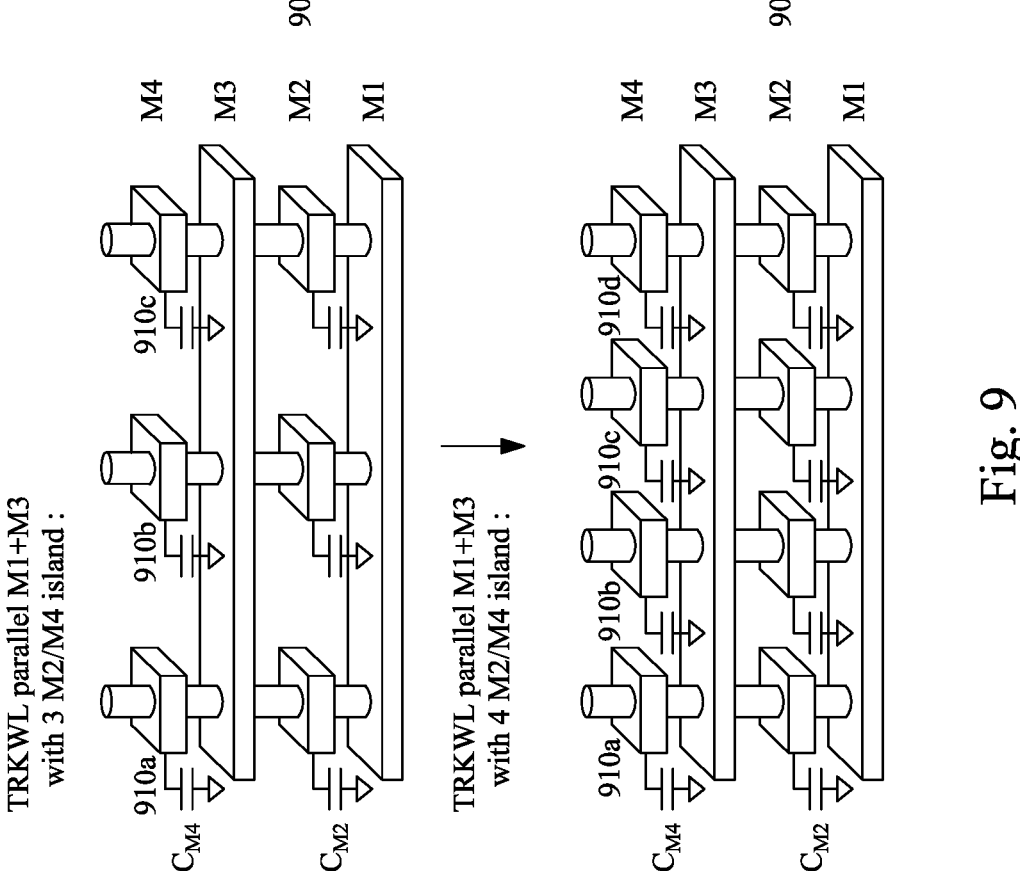
FIG. 9 illustrates a cross-sectional view of an example tracking scheme circuit shown in FIG. 1, in accordance with some embodiments.

FIG. 9 illustrates a cross-sectional view of an example tracking scheme circuit 110 shown in FIG. 1, in accordance with some embodiments. FIG. 9 illustrates tracking word line (TRKWL) using different number of metallization islands to adjust a capacitance level of a tracking scheme.

For example in FIG. 9, the tracking scheme circuit 902 may utilize three M2/M4 islands (e.g., 910a, 910b, 910c) and the tracking scheme circuit 904 may utilize four M2/M4 islands (e.g., 910a, 910b, 910c, 910d). The capacitance level of a tracking scheme can be adjusted by manipulating the number of M2/M4 islands present. The M2/M4 island count can be utilized to modify the loading characteristics within the tracking scheme. By increasing the number of M2/M4 islands, the capacitance level can be effectively adjusted (e.g., from $+1*(C_{M2}+C_{M4})$ to $N*(C_{M2}+C_{M4})$), allowing for fine-tuning of the tracking scheme's performance and behavior.

Figure 10:
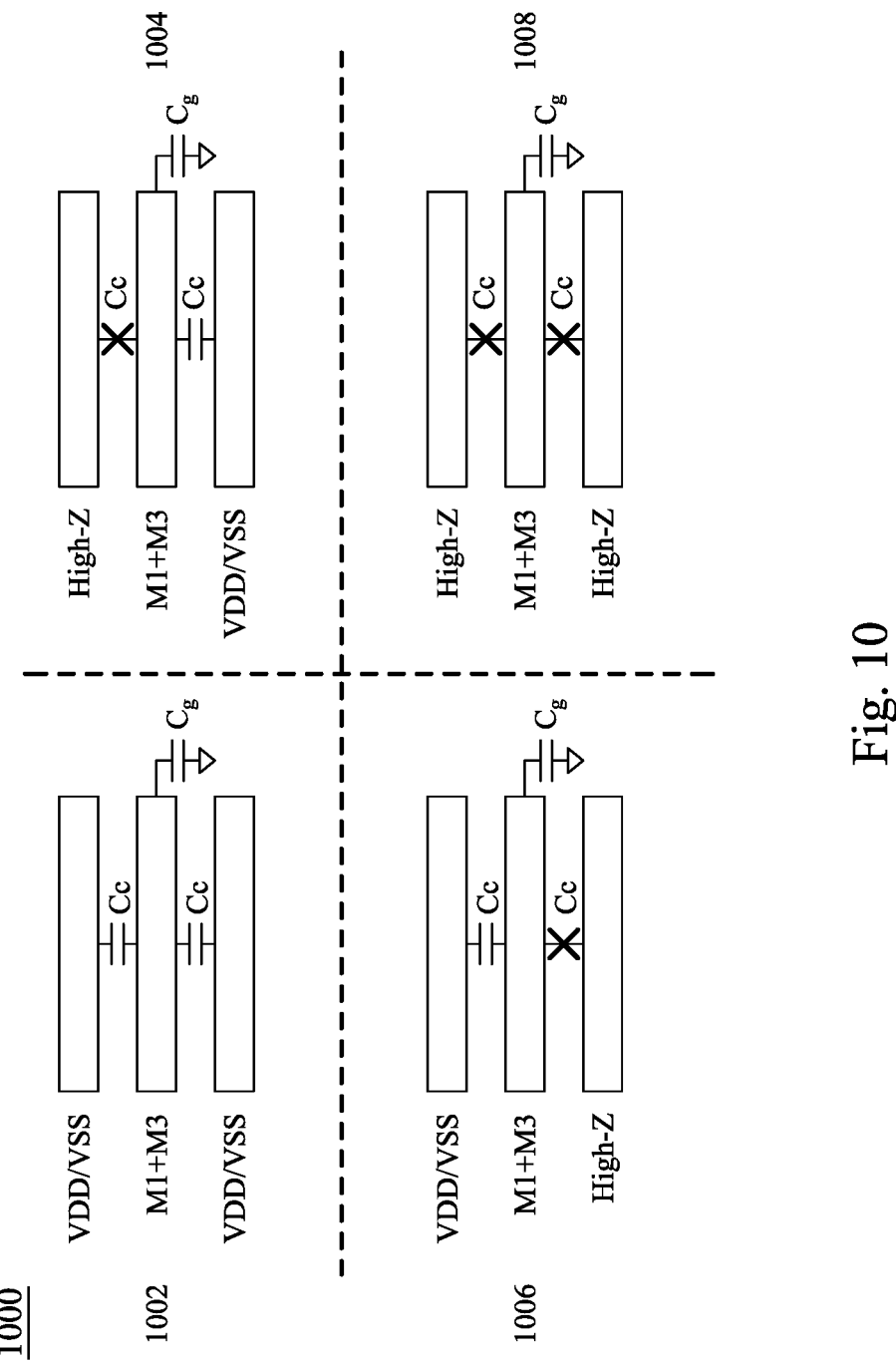
FIG. 10 illustrates a schematic diagram of the tracking scheme circuit shown in FIG. 1, in accordance with some embodiments.

FIG. 10 illustrates a schematic diagram of the tracking scheme circuit 110 shown in FIG. 1, in accordance with some embodiments. FIG. 10 illustrates tracking word line (TRKWL) using a floating metal layer to adjust a capacitance level of a tracking scheme.

To adjust the capacitance in a tracking scheme, a floating metal nearby approach can be employed. By utilizing a floating metal layer (which may not contribute capacitance), capacitance contributions can be adjusted, allowing for varying levels of loading within the tracking scheme. The use of floating metal (does not contribute significant capacitance) enables flexibility in adjusting the overall capacitance and optimizing the performance of the tracking scheme.

For example in FIG. 10 and Table 5, the first tracking word line 1002, when implemented with the M1+M3 combination, can be positioned adjacent to two metal layers carrying VDD/VSS voltage. This proximity can lead to a combined capacitance of 2*Cc+Cg, where Cc represents the capacitance contributed by the metal layers and Cg denotes any other relevant capacitance.

Continuing with FIG. 10 and Table 5, the first tracking word line 1004, when implemented with the M1+M3 combination, can be positioned adjacent to a metal layer carrying VDD/VSS voltage and a high-Z (high impedance) metal layer. This arrangement results in a combined capacitance of Cc+Cg, where Cc represents the capacitance contributed by the metal layers and Cg represents any other relevant capacitance.

Continuing with FIG. 10 and Table 5, the first tracking word line 1006, when implemented with the M1+M3 combination, can be positioned adjacent to a high-Z (high impedance) metal layer and a metal layer carrying VDD/VSS voltage. This arrangement results in a combined capacitance of Cc+Cg, where Cc represents the capacitance contributed by the metal layers and Cg represents any other relevant capacitance.

Continuing with FIG. 10 and Table 5, the first tracking word line 1008, when implemented with the M1+M3 combination, can be positioned adjacent to two high-Z (high impedance) metal layers. This arrangement results in a combined capacitance of Cg, where Cg represents any other relevant capacitance.

TABLE 5

| Voltage on metal beside tracking signal | VDD/VSS | High-Z |
|---|---|---|
| VDD/VSS | 2*Cc + Cg | Cc + Cg |
| High-Z | Cc + Cg | Cg |

Figure 11:
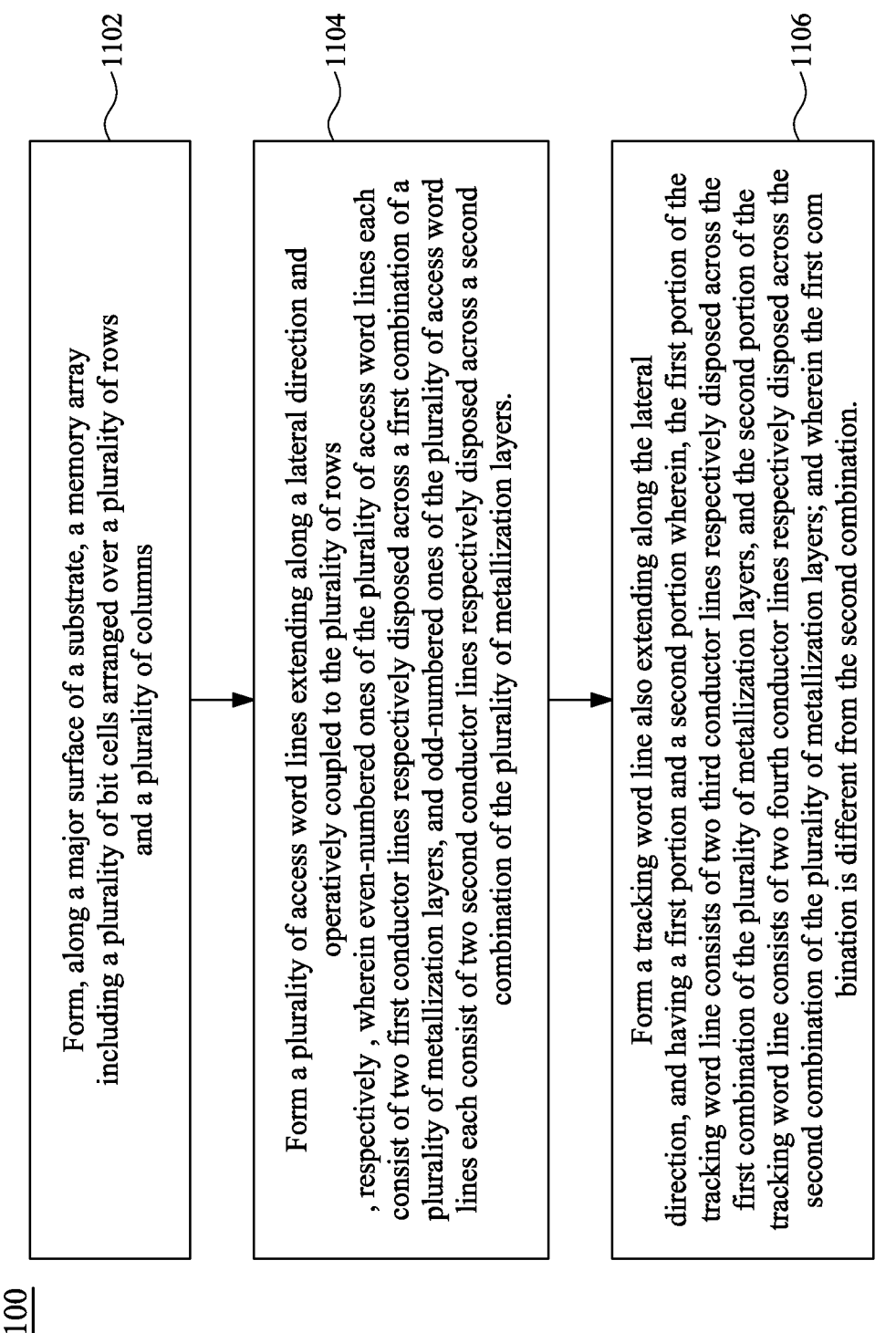
FIG. 11 illustrates a flow chart of an example method for fabricating the tracking scheme circuit shown in FIG. 1, in accordance with some embodiments.

FIG. 11 illustrates a flow chart of an example method for fabricating the tracking scheme circuit 110 shown in FIG. 1, in accordance with some embodiments. The method 1100 may be used to fabricating the first tracking word line 110. It is noted that the method 1100 is merely an example and is not intended to limit the present disclosure. Accordingly, it is understood that additional operations may be provided before, during, and after the method 1100 of FIG. 11, and that some other operations may only be briefly described herein.

The method 1100 starts with operation 1102 in which a memory array 102 including a plurality of bit cells 104 arranged over a plurality of rows 106 and a plurality of columns 108 is formed along a major surface of a substrate. For example in FIG. 1, the plurality of rows may operatively correspond to the plurality of access WLs 106, respectively. The plurality of columns may operatively correspond to the plurality of access BLs 108, respectively.

The method 1100 continues to operation 1104 in which a plurality of access word lines 106 extending along a lateral direction and operatively coupled to the plurality of rows 108 are formed respectively. Continuing with the above example in FIG. 1, even-numbered ones of the plurality of access word lines 106 (e.g., WL[0], WL[2], WL[4] . . . ) may each consist of two first conductor lines respectively disposed across a first combination (e.g., M1+M3) of a plurality of metallization layers disposed above the major surface. Odd-numbered ones of the plurality of access word lines 106 (e.g., WL[1], WL[3], WL[5] . . . ) may each consist of two second conductor lines respectively disposed across a second combination (e.g., M1+M5) of the plurality of metallization layers. Conventionally, the utilization of even/odd word lines (WLs) can lead to challenges in precisely tracking the resistive-capacitive (RC) delay of each WL. For instance, a delay tracking scheme that employs the first combination (e.g., M1 and M3) WLs may not accurately capture the RC delay for the second combination (e.g., M1 and M5) WLs.

The method 1100 continues to operation 1106 in which a tracking word line 110 extends along the lateral direction is formed. The tracking word line 110 may have a first portion 112 and a second portion 114. Continuing with the above example in FIG. 1, the first portion 112 of the tracking word line 110 may consist of two third conductor lines respectively disposed across the first combination of the plurality of metallization layers (e.g., M1+M3). The second portion 114 of the tracking word line 110 may consist of two fourth conductor lines respectively disposed across the second combination of the plurality of metallization layers (e.g., M1+M5). The present disclosure provides a tracking scheme introducing changes to the tracking path (e.g., the tracking word line 110) in SRAM designs. The tracking word line 110 utilizes M1+M3 in the first half (e.g., the first portion 112) and M1+M5 in the last half (e.g., the second portion 114) for the tracking word line (WL) path. The first combination can be different from the second combination. In some embodiments, the tracking word line 110 is configured to track propagation time present on the access word lines 106. The first portion 112 of the tracking word line 110 extends from an edge of the memory array 102 to a middle of the memory array 102 and the second portion 114 of the tracking word line 110 extends from the middle of the memory array 102 to the edge of the memory array 102. This tracking scheme method is versatile and can be applied to various advanced SRAM processes, offering improved performance and adaptability.

The proposed tracking scheme improves the performance of SRAM designs by altering the tracking path and incorporating address decoding. Specifically, the tracking WL path utilizes M1+M3 in the first half and M1+M5 in the last half. This combination allows for more precise tracing of the real WL RC delay. The proposed tracking scheme method is applicable to all advanced SRAM processes, offering compatibility and versatility. The advantages of this disclosure include a reduction in the variation of macro data output delay (Tcd) and compatibility with all advanced SRAM processes. By minimizing Tcd variation, the proposed tracking scheme enhances the consistency and reliability of SRAM operation. The proposed tracking scheme can be compatible across different advanced SRAM processes.

As used herein, the terms "about" and "approximately" generally indicate the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

a memory array including a plurality of bit cells arranged over a plurality of rows and a plurality of columns;

a plurality of access word lines extending along a lateral direction, the plurality of rows operatively corresponding to the plurality of access word lines, respectively; and a first tracking word line also extending along the lateral direction, and having a first portion extending from an edge of the memory array to a middle of the memory array and a second portion extending from the middle of the memory array to the edge of the memory array;

wherein the first portion of the first tracking word line includes at least two first conductor lines respectively disposed across a first combination of a plurality of metallization layers, and the second portion of the first tracking word line includes at least two second conductor lines respectively disposed across a second combination of the plurality of metallization layers;

wherein the first combination is different from the second combination; and wherein the at least two first conductor lines are coupled to each other through a plural number of first via structures, and the at least two second conductor lines are coupled to each other through a plural number of second via structures.

2. The memory device of claim 1, wherein the first combination includes a first one of the plurality of metallization layers that is the first closest to the memory array and a second one of the plurality of metallization layers that is the fifth closest to the memory array, and the second combination includes the first metallization layer and a third one of the plurality of metallization layers that is the third closest to the memory array.

3. The memory device of claim 1, wherein the first combination includes a first one of the plurality of metallization layers that is the fifth closest to the memory array, and the second combination includes a second one of the plurality of metallization layers that is the first closest to the memory array and a third one of the plurality of metallization layers that is the third closest to the memory array.

4. The memory device of claim 1, wherein the first combination includes a first one of the plurality of metallization layers that is the first closest to the memory array and a second one of the plurality of metallization layers that is the fifth closest to the memory array, and the second combination includes a third one of the plurality of metallization layers that is the third closest to the memory array.

5. The memory device of claim 1, wherein one of the at least two first conductor lines is further coupled to a plural number of third via structures, and one of the at least two second conductor lines is further coupled to a plural number of fourth via structures.

6. The memory device of claim 1, further comprising:

a second tracking word line also extending along the lateral direction, and having a first portion extending from the edge of the memory array to the middle of the memory array and a second portion extending from the middle of the memory array to the edge of the memory array; and a third tracking word line also extending along the lateral direction, and having a first portion extending from the edge of the memory array to the middle of the memory array and a second portion extending from the middle of the memory array to the edge of the memory array.

7. The memory device of claim 6, wherein the first to third tracking word lines are each configured to track propagation time present on the access word lines.

8. The memory device of claim 6, wherein the first portion of the second tracking word line includes at least two third conductor lines respectively disposed across the first combination of the plurality of metallization layers, and the second portion of the second tracking word line include at least two fourth conductor lines respectively disposed across the first combination of the plurality of metallization layers.

9. The memory device of claim 8, wherein the first portion of the third tracking word line includes at least two fifth conductor lines respectively disposed across the second combination of the plurality of metallization layers, and the second portion of the third tracking word line include at least two sixth conductor lines respectively disposed across the second combination of the plurality of metallization layers.

10. The memory device of claim 6, wherein the second and third tracking word lines are each selected based on a signal decoding one of the plurality of access word lines, while the first tracking word line is selected independently of the signal.

11. A memory device, comprising:
a plurality of access word lines extending along a lateral direction and corresponding to a plurality of rows a memory array, respectively; and
a first tracking word line also extending along the lateral direction, and having a first portion and a second portion;
wherein even-numbered ones of the plurality of access word lines each consist of two first conductor lines respectively disposed across a first combination of a plurality of metallization layers;
wherein odd-numbered ones of the plurality of access word lines each consist of two second conductor lines respectively disposed across a second combination of the plurality of metallization layers;
wherein the first portion of the first tracking word line consists of two third conductor lines respectively disposed across the first combination of the plurality of metallization layers, and the second portion of the first tracking word line consists of two fourth conductor lines respectively disposed across the second combination of the plurality of metallization layers; and
wherein the first combination is different from the second combination.

12. The memory device of claim 11, wherein the first combination includes a first one of the plurality of metallization layers that is the first closest to the memory array and a second one of the plurality of metallization layers that is the fifth closest to the memory array, and the second combination includes the first metallization layer and a third one of the plurality of metallization layers that is the third closest to the memory array.

13. The memory device of claim 11, wherein the two third conductor lines are coupled to each other through a plural number of first via structures, and the two fourth conductor lines are coupled to each other through a plural number of second via structures.

14. The memory device of claim 13, wherein one of the two third conductor lines is further coupled to a plural number of third via structures, and one of the two fourth conductor lines is further coupled to a plural number of fourth via structures.

15. The memory device of claim 11, further comprising:
a second tracking word line also extending along the lateral direction, and having a first portion and a second portion; and
a third first tracking word line also extending along the lateral direction, and having a first portion and a second portion;
wherein the first portion of the second tracking word line consists of two fifth conductor lines respectively disposed across the first combination of the plurality of metallization layers, and the second portion of the second tracking word line include at least two sixth conductor lines respectively disposed across the first combination of the plurality of metallization layers; and
wherein the first portion of the third tracking word line includes at least two seventh conductor lines respectively disposed across the second combination of the plurality of metallization layers, and the second portion of the second tracking word line include at least two eighth conductor lines respectively disposed across the second combination of the plurality of metallization layers.

16. The memory device of claim 15, wherein the second and third tracking word lines are each selected based on a signal decoding one of the plurality of access word lines, while the first tracking word line is selected independently of the signal.

17. A method for fabricating memory devices, comprising:
forming, along a major surface of a substrate, a memory array including a plurality of bit cells arranged over a plurality of rows and a plurality of columns;
forming a plurality of access word lines extending along a lateral direction and operatively coupled to the plurality of rows, respectively, wherein even-numbered ones of the plurality of access word lines each consist of two first conductor lines respectively disposed across a first combination of a plurality of metallization layers disposed above the major surface, and odd-numbered ones of the plurality of access word lines each consist of two second conductor lines respectively disposed across a second combination of the plurality of metallization layers; and
forming a tracking word line also extending along the lateral direction, and having a first portion and a second portion;
wherein the first portion of the tracking word line consists of two third conductor lines respectively disposed across the first combination of the plurality of metallization layers, and the second portion of the tracking word line consists of two fourth conductor lines respectively disposed across the second combination of the plurality of metallization layers; and
wherein the first combination is different from the second combination.

18. The method of claim 17, wherein the tracking word line is configured to track propagation time present on the access word lines.

19. The method of claim 17, wherein the first portion of the tracking word line extends from an edge of the memory array to a middle of the memory array and the second portion of the tracking word line extends from the middle of the memory array to the edge of the memory array.

20. The method of claim 17, wherein the first combination includes a first one of the plurality of metallization layers that is the first closest to the memory array and a second one of the plurality of metallization layers that is the fifth closest to the memory array, and the second combination includes the first metallization layer and a third one of the plurality of metallization layers that is the third closest to the memory array.

* * * * *